US006647998B2

(12) United States Patent
Twu et al.

(10) Patent No.: US 6,647,998 B2
(45) Date of Patent: Nov. 18, 2003

(54) ELECTROSTATIC CHARGE-FREE SOLVENT-TYPE DRYER FOR SEMICONDUCTOR WAFERS

(75) Inventors: Jih-Churng Twu, Chung-Ho (TW); Ming-Dar Guo, Tainan (TW); Tsung-Chieh Tsai, Tainan (TW); Sheng-Hsiung Tseng, Tainan (TW); Wei-Ming You, Taipei (TW); Yao-Pin Huang, Tainan (TW); Chia-Chun Cheng, Tainan (TW); Chin-Hsiung Ho, Sunnyvale, CA (US); Ming Te More, Tainan (TW)

(73) Assignee: Taiwan Semiconductor Manufacturing Co. Ltd., Hsin Chu (TW)

( * ) Notice: Subject to any disclaimer, the term of this patent is extended or adjusted under 35 U.S.C. 154(b) by 213 days.

(21) Appl. No.: 09/885,772

(22) Filed: Jun. 20, 2001

(65) Prior Publication Data

US 2002/0195130 A1 Dec. 26, 2002

(51) Int. Cl.$^7$ ................................................. B08B 3/10
(52) U.S. Cl. ........................... 134/61; 134/83; 134/135; 134/902; 134/1.3; 34/130
(58) Field of Search ................ 134/1, 1.3, 61, 134/82, 83, 133, 135, 143, 182, 183, 902, 201; 34/72, 130

(56) References Cited

U.S. PATENT DOCUMENTS

| | | | | |
|---|---|---|---|---|
| 4,569,695 | A | * | 2/1986 | Yamashita et al. |
| 4,677,704 | A | * | 7/1987 | Huggins |
| 5,351,415 | A | * | 10/1994 | Brooks et al. |
| 5,435,075 | A | * | 7/1995 | Shiraishi et al. |
| 6,367,490 | B1 | * | 4/2002 | Namba |
| 6,391,118 | B2 | * | 5/2002 | Fuji et al. |
| 6,526,997 | B1 | * | 3/2003 | Henly |

FOREIGN PATENT DOCUMENTS

| | | | |
|---|---|---|---|
| JP | 62-26823 | * | 2/1987 |
| JP | 2-298031 | * | 12/1990 |
| JP | 3-125428 | * | 5/1991 |
| JP | 4-7830 | * | 1/1992 |
| JP | 4-207031 | * | 7/1992 |
| JP | 5-47738 | * | 2/1993 |
| JP | 5-62959 | * | 3/1993 |
| JP | 5-115858 | * | 5/1993 |
| JP | 5-234976 | * | 9/1993 |
| JP | 5-243200 | * | 9/1993 |
| JP | 6-37073 | * | 2/1994 |
| JP | 6-53200 | * | 2/1994 |
| JP | 6-120185 | * | 4/1994 |
| JP | 7-230891 | * | 8/1995 |
| JP | 8-181095 | * | 7/1996 |
| JP | 63-292629 | * | 11/1998 |
| JP | 11-111659 | * | 4/1999 |
| JP | 11-232642 | * | 8/1999 |

* cited by examiner

Primary Examiner—Frankie L. Stinson
(74) Attorney, Agent, or Firm—Tung & Associates

(57) ABSTRACT

An electrostatic charge-free solvent-type dryer for drying semiconductor wafers after a wet bench process is disclosed in a preferred embodiment and in an alternate embodiment. In the preferred embodiment, the electrostatic charge-free solvent-type dryer is constructed by a tank body, a wafer carrier, an elevator means, a tank cover and a conduit for feeding the flow of solvent vapor. At least one of the tank cover, the conduit for feeding the flow of solvent vapor and the plurality of partition plates is fabricated of a non-electrostatic material such that electrostatic charge is not generated in the flow of solvent vapor. In the alternate embodiment, a deionizer is further provided in the tank cavity for producing a flux of positive ions to neutralize any negative ions that are possibly produced in the flow of solvent vapor.

20 Claims, 3 Drawing Sheets

ELECTROSTATIC CHARGE-FREE SOLVENT-TYPE DRYER FOR SEMICONDUCTOR WAFERS

FIELD OF THE INVENTION

The present invention generally relates to a solvent-type dryer for drying semiconductor wafers after a wet bench process and more particularly, relates to an electrostatic charge-free solvent-type dryer for semiconductor wafers incorporating at least one of a tank cover, a plurality of partition plates and a solvent vapor dispersion conduit fabricated of a non-electrostatic material such that electrostatic charge is not generated in a flow of the solvent vapor for drying the wafers.

BACKGROUND OF THE INVENTION

In the fabrication of semiconductor devices, a large quantity of deionized (DI) water is frequently used to clean wafers in a wet bench process. For instance, when residual chemical must be removed from the surface of a wafer, DI water rinse is used in the wet bench process to perform major wafer cleaning operations such as quick-dump-rinse and cascade overflow rinse. It is desirable that the surface of the wafer be cleaned by DI water after a chemical or polishing process has been conducted on the wafer, i.e. oxide or nitride deposition, etching or chemical mechanical polishing process. The wet bench wafer cleaning step can be accomplished by equipment that is installed either in-line or in a batch-type process.

A typical automated wafer scrubber combines brush and solution scrubbing by DI water. The scrubber utilizes a hyperbolic high-pressure spray of DI water with a retractable cleaning brush. A typical wafer scrubbing process consists of a DI water spray step followed by a spin dry and nitrogen gas blow dry step. More recently, the solvent drying technology such as the use of isopropyl alcohol (IPA) has been developed to further improve the drying technology.

In a solvent drying technology, such as one that utilizes IPA shown in FIG. 1, the drying process is conducted in a static manner or with the wafer positioned statically without movement. The wafer drying 10 is constructed of a drying tank 12 constructed with a wafer receptacle 14, a chiller 16, a sidewall heater 18 and a bottom heater 20. A cleaned and wet wafer is transported into the drying tank 12, or the vapor chamber. A vapor of IPA is transported into the chamber cavity 22 by a carrier gas such as a high purity nitrogen, or any other high purity inert gas. The vapor enters into cavity 22 is then heated by the bottom heater 20 such that IPA is further vaporized and rises into the cavity 22. The wafer 24 is surrounded by the IPA vapor and, due to the high volatility of IPA, water on the wafer surface can be evaporated away without leaving any water mark, contaminating particles or metal particles. The vapor pressure of IPA can be suitably adjusted such that there is a steady flow of IPA vapor in the cavity 22 fed from the IPA reservoir tank 26.

In the conventional IPA drying tank 10 shown in FIG. 1, the only moving part for transferring wafers into and out of the chamber cavity is a robot arm. There are no other moving parts which can produce contaminating particles. The IPA drying chamber can thus be kept in an extremely clean condition to avoid any contamination of the wafer surface. To further maintain the cleanliness of the chamber cavity 22, an air filter 28 is utilized for filtering incoming air into the cavity 22 and for providing a suitable flow rate of the IPA vapor. After the cleaning process is completed, the water-containing IPA vapor is condensed by the chiller 16 into IPA liquid and is collected at the bottom of the drying chamber 12 for recycling and reuse by the process. The IPA vapor drying process is normally controlled by three major elements, i.e. the purity and the water content of IPA; the flow rate and flow speed of the IPA vapor; and the cleanliness of the IPA vapor.

An improved solvent drying technique has been proposed in recent years which is similar in principal to that described above.

In a Maragoni dryer, the drying principal is based on the different surface tensions of IPA and DI water. The different surface tensions cause the ejection of water molecules from the wafer surface which are then collected by a reservoir in the drying apparatus. The Maragoni drying process is carried out by slowly withdrawing a wafer from a DI water tank immersed in DI water. At the same time, IPA vapor carried by $N_2$ carrier gas is flown onto the wet wafer surface such that IPA is saturated on the exposed wafer surface above the water level. Since the concentration of IPA on the surface of the exposed wafer is larger than the concentration of DI water, the surface tension of IPA is smaller than the surface tension of water in the water tank. This causes the water molecules on the surface of the exposed wafer to be retracted into the water tank and thus achieving the drying purpose.

A typical Maragoni dryer 40 is shown in FIG. 2. The Maragoni dryer 40 is constructed by an upper chamber section 52, a lower chamber section 44 which is also an outer tank, an inner tank 42 for holding a volume of DI water 62 therein, a drain conduit 50 in fluid communication with the outer chamber 44, a wafer carrier 46 for carrying a plurality of semiconductor wafers 60, an elevator means 48 for lowering and raising the wafer carrier 46 into and out of the volume of DI water 62, and a tank cover, or lid member 54. The outer tank 44 is formed by a tank wall 68 defining a cavity 56 therein for receiving an overflow of DI water 62 from the inner tank 42 when the wafer cassette 46 is lowered into the volume of DI water 62. The inner tank 42 is defined by sidewall 72 for holding the volume of DI water 62 therein. A cavity 58 is formed when the wafer carrier 46 is lowered into the volume of DI water 62 and the tank cover 54 is slid over the top of the inner tank 42 forming a hermetically sealed chamber.

A wafer drying process typically can be carried out in the Maragoni dryer 40 in the following manner. First, the wafer carrier 46, together with the plurality of wafers 60, i.e. as many as 50 wafers, are first immersed in the volume of DI water 62 for rinsing the wafers and for removing any residual processing chemicals which may have been left on the wafer surface. After a soaking time of approximately between 1 and 2 min., a drying cycle of approximately 10 min. is carried out. In the first part of the drying cycle, instead of only nitrogen gas being flown into the chamber cavity 58 during the DI water soaking cycle, additional amounts of IPA vapor is flown into the chamber cavity 58 through a multiplicity of apertures 64 provided in a lower compartment wall 66 of a compartment 70. These are shown in FIGS. 3A and 3B of a top view and a side view of tank cover 54, respectively. At the end of the Part 1 drying cycle, the DI water 62 is drained out of the inner tank 42. During the Part 1 of the drying cycle, the wafer carrier 46, together with the plurality of wafers 60, are slowly raised out of the volume of DI water 62 and thus a Maragoni drying process is conducted by the saturated IPA vapor.

In the second part of the drying cycle, which takes only about 60 sec., the flow of IPA vapor into the tank cavity 58 is stopped such that only nitrogen is flown into the tank cavity 58. The DI water 62 is completely drained out of the inner tank 42, such that the wafer carrier 46 and the plurality of wafers 60 in their dried state can be lowered into the empty inner tank 42. The tank cover 54 is then slid to the side (as shown in FIG. 2) to allow access to the wafer carrier 46 after it is moved up by the elevator means. The plurality of wafers 60 is then removed by robot means (not shown) and thus, the Maragoni drying process is completed.

Also shown in FIGS. 3A and 3B are a solvent vapor dispersing conduit 74 and a plurality of partition plates 76 to allow a more uniform distribution of the solvent vapor into the tank cavity 58 during the Maragoni drying process.

While the Maragoni drying process has been satisfactorily utilized in drying semiconductor wafers, certain drawbacks of the process do exist. One of the drawbacks is that the flow of solvent vapor into the drying tank cavity frequently carriers an electrostatic charge. The electrostatic charge as evidenced by the negative OH ions is generated when the flow of solvent vapor through a solvent vapor delivery tube that is frequently fabricated of an electrostatic charge causing plastic material. Moreover, the tank cover itself, into which the solvent vapor delivery tube is mounted, and the partition plates that are attached to the tank cover may also be fabricated of a plastic material that frequently cause an electrostatic charge in the solvent vapor that flows therethrough. The electrostatic charge in the solvent vapor may be transferred to the wafer surface when the solvent vapor is impinged on the wafer and thus causing serious silicon pitting or silicon hole defects on the wafer surface. Such defects, when occurring at a high frequency, may result in a silicon wafer to be scrapped. The attack on the silicon wafer surface by the electrostatic charge therefore must be prevented or completely eliminated.

It is therefore an object of the present invention to provide an electrostatic charge-free solvent-type dryer for drying semiconductor wafers that does not have the drawbacks or shortcomings of the conventional solvent-type dryers.

It is another object of the present invention to provide an electrostatic charge-free solvent-type dryer for drying semiconductor wafers wherein the components of the dryer that are in contact with a flow of the solvent vapor are fabricated of a non-electrostatic material.

It is a further object of the present invention to provide an electrostatic charge-free solvent-type dryer for drying semiconductor wafers that does not generated electrostatic charge in a flow of solvent vapor that is used for drying the wafers.

It is another further object of the present invention to provide an electrostatic charge-free solvent-type dryer for drying semiconductor wafers wherein at least one of the components of a tank cover, a plurality of partition plates and a solvent vapor dispersing conduit is fabricated of a non-electrostatic material.

It is still another object of the present invention to provide an electrostatic charge-free solvent-type dryer for drying semiconductor wafers wherein at least one of the major components of the drying that is in contact with a flow of solvent vapor is fabricated of a non-electrostatic polymeric material.

It is yet another object of the present invention to provide an electrostatic charge-free solvent-type dryer for drying semiconductor wafers wherein at least one of the components of a tank cover, a plurality of partition plates and a solvent vapor dispersing conduit is fabricated of a PEEK plastic.

It is still another further object of the present invention to provide an electrostatic charge-free solvent-type dryer for drying semiconductor wafers incorporating the use of a deionizing means for generating a flux of positive ions to neutralize any negative ions contained in a flow of solvent vapor for drying the wafers.

SUMMARY OF THE INVENTION

In accordance with the present invention, an electrostatic charge-free solvent-type dryer for drying semiconductor wafers after a wet bench process that utilizes a non-electrostatic material for fabricating the components of the drying in contact with the flow of solvent vapor, and optionally a deionizer, is provided.

In a preferred embodiment, an electrostatic charge-free solvent-type dryer for drying semiconductor wafers is provided which includes a tank body for holding a volume of water therein; a wafer carrier for holding a plurality of wafers therein; an elevator means for lowering and raising the wafer carrier into and out of the volume of water; a tank cover for covering an open top of the tank body forming a hermetically sealed cavity therein, the cover has a plurality of partition plates formed perpendicular to an interior surface of the cover extending downwardly into the tank cavity when the cover is mounted on the body; a conduit for feeding a flow of solvent vapor into the sealed cavity; wherein at least one of the tank cover, the plurality of partition plates and the conduit is fabricated of a non-electrostatic material such that electrostatic charge is not generated in the flow of solvent vapor.

In the electrostatic charge-free solvent-type dryer for drying semiconductor wafers, the plurality of partition plates comprises at least three partition plates, the plurality of partition plates each has a height that is at least one-half of a height of the sealed cavity. The conduit feeds an alcohol vapor carried by a flow of inert gas, the conduit further includes a multiplicity of apertures through a wall of the conduit for dispersing the solvent vapor into the sealed cavity. The non-electrostatic material is a polymeric material, one of such suitable polymeric materials is PEEK. The at least one of the tank cover, the plurality of partition plates and the conduit is fabricated of a non-electrostatic and hydrophobic material. The tank cover being provided with a cavity for receiving the conduit and the interior surface of the tank cover being provided with a multiplicity of apertures such that solvent vapor is dispersed by the tank cover through the multiplicity of apertures. The dryer may further include a deionizer for generating positive ions for feeding to the flow of solvent vapor. The plurality of partition plates may be coated with a material that includes silicone for reducing organic residue deposition on the plurality of partition plates, the plurality of partition plates may further be fabricated of quartz for achieving the same purpose.

The present invention is further directed to an electrostatic charge-free solvent-type dryer for drying semiconductor wafers which includes a tank body for holding a volume of DI water therein; a wafer carrier for holding a plurality of wafers therein; an elevator for lowering and raising the wafer carrier into and out of the volume of water; a tank cover for covering an open top of the tank body forming a hermetically sealed cavity therein, the cover may have a plurality of partition plates formed perpendicular to an interior surface of the cover extending downwardly into the tank cavity when the cover is mounted on the body; a conduit for feeding a flow of solvent vapor into the sealed cavity; a deionizing means for generating a flux of positive ions to neutralize negative ions in the flow of solvent vapor; wherein at least one of the tank cover, the plurality of partition plates and the conduit is fabricated of a non-electrostatic material such that an electrostatic charge is not generated in the flow of solvent vapor.

In the electrostatic charge-free solvent-type dryer for drying semiconductor wafers, the plurality of partition plates may be coated with silicone for reducing organic residue deposition on the plurality of partition plates, or may be fabricated of quartz for achieving the same purpose. The plurality of partition plates may include at least three partition plates, each of the plates has a height that is at least one-half of a height of the sealed cavity.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENTS

The present invention discloses an electrostatic charge-free solvent-type dryer for drying semiconductor wafers after a wet bench process that incorporates major components which are in contact with a flow of solvent vapor that are fabricated of a non-electrostatic material such that any generation of electrostatic charge in the flow of solvent vapor can be avoided. Alternatively, the present invention further discloses an electrostatic charge-free solvent-type dryer for drying semiconductor wafers after a wet bench process that not only includes components fabricated of a non-electrostatic material, but further incorporates a deionizer for generating a flux of positive ions to neutralize any possible negative ions produces in the flow of solvent vapor.

In the preferred embodiment, the electrostatic charge-free solvent-type dryer for drying semiconductor wafers after a wet bench can be constructed by a tank body, a wafer carrier, an elevator means, a tank cover, and a conduit for feeding a flow of solvent vapor into a sealed cavity formed by the tank body and the tank cover. The tank cover further includes a plurality of partition plates formed perpendicular to an interior surface of the cover extending downwardly into the tank cavity when the cover and the tank body are intimately engaged together. According to the present invention, at least one, and preferably all three components of the tank cover, the plurality of partition plates, and the conduit is fabricated of a non-electrostatic material such that an electrostatic charge is not generated in the flow of solvent vapor. By utilizing the present invention novel apparatus, any electrostatic charge damage to the silicon wafer, such as in the form of silicon pitting or silicon hole formation, can be avoided.

In the alternate embodiment, the present invention electrostatic charge-free solvent-type dryer may further include a deionizing means which is capable of generating a flux of positive ions for feeding into the tank cavity in order to neutralize any possible negative ions generated in the flow of solvent vapor.

To provide the present invention electrostatic charge-free solvent-type dryer, the essential components that are in contact with the flow of solvent vapor should be fabricated of a non-electrostatic material. A variety of such non-electrostatic material is available commercially. For instance, a well-known non-electrostatic metal would be aluminum, while a well-known non-electrostatic material of polymeric nature would be PEEK.

Figure 1:
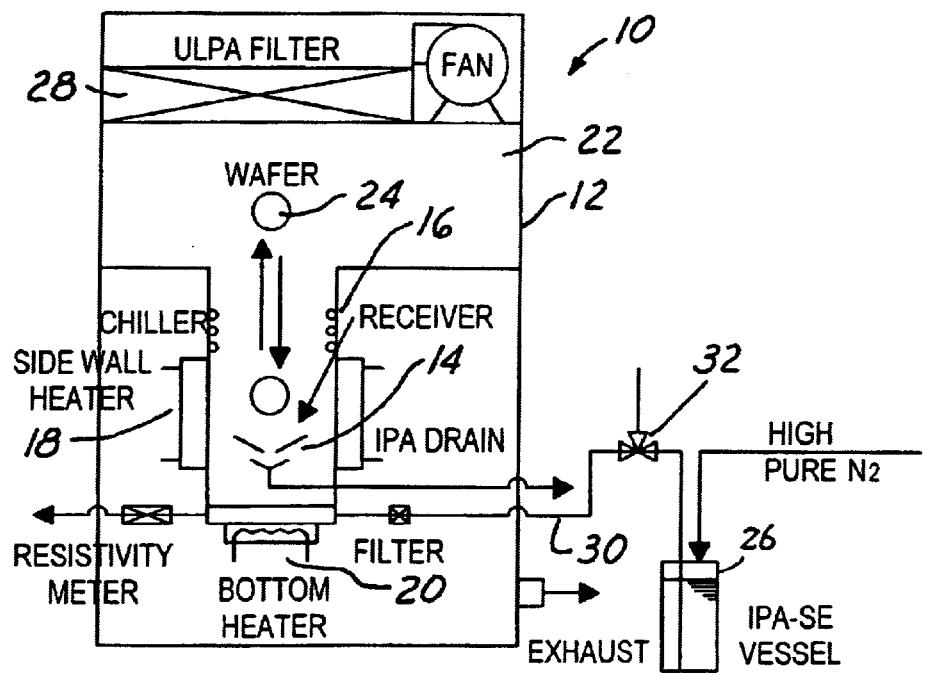
FIG. 1 is a cross-sectional view of a conventional solvent-type dryer for drying semiconductor wafers after a wet bench process.
Figure 2:
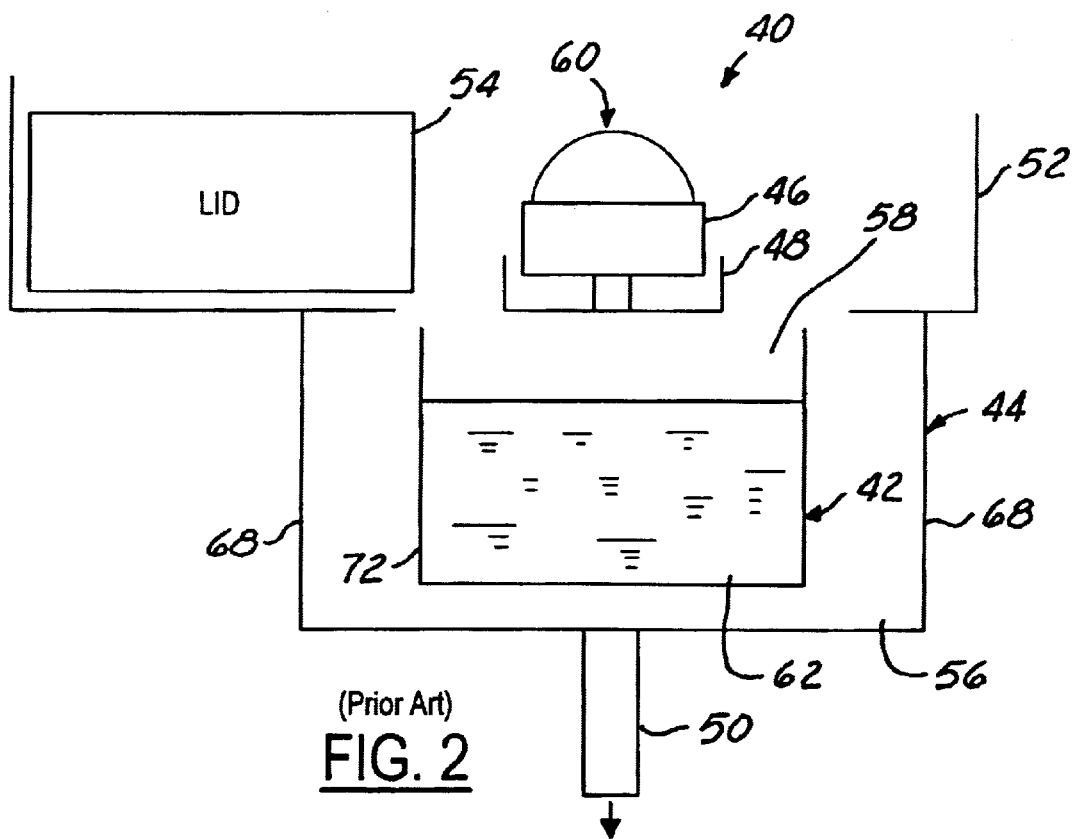
FIG. 2 is a simplified, cross-sectional view of a Maragoni dryer that is commercially available.
Figure 3A:
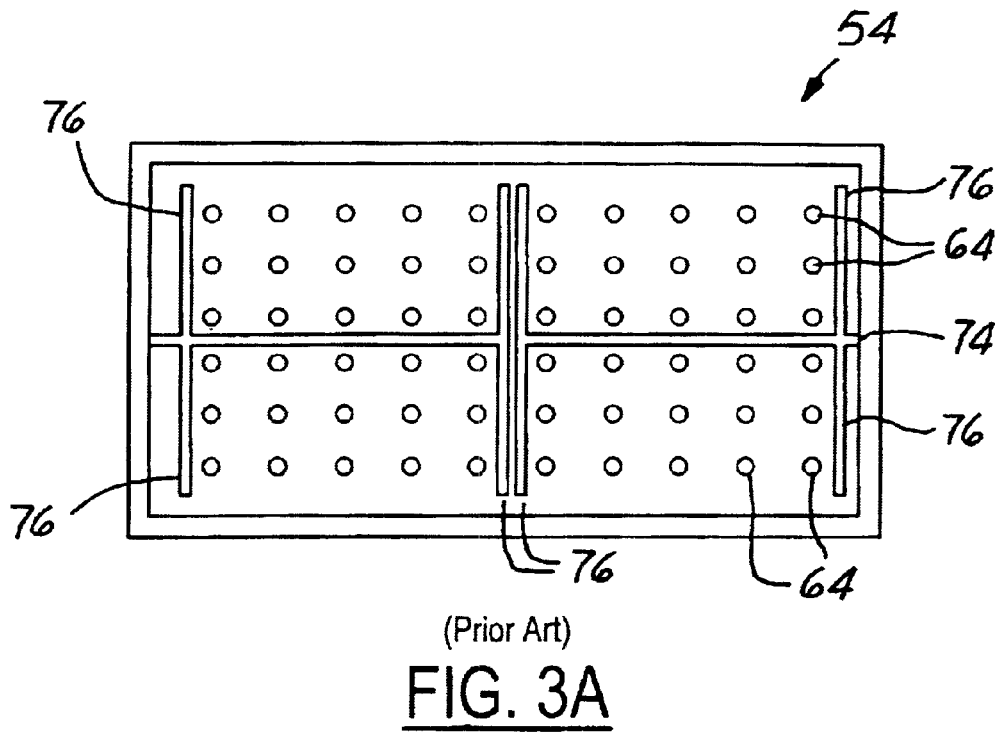
FIG. 3A is a top view of the tank cover of the Maragoni dryer of FIG. 2.
Figure 3B:
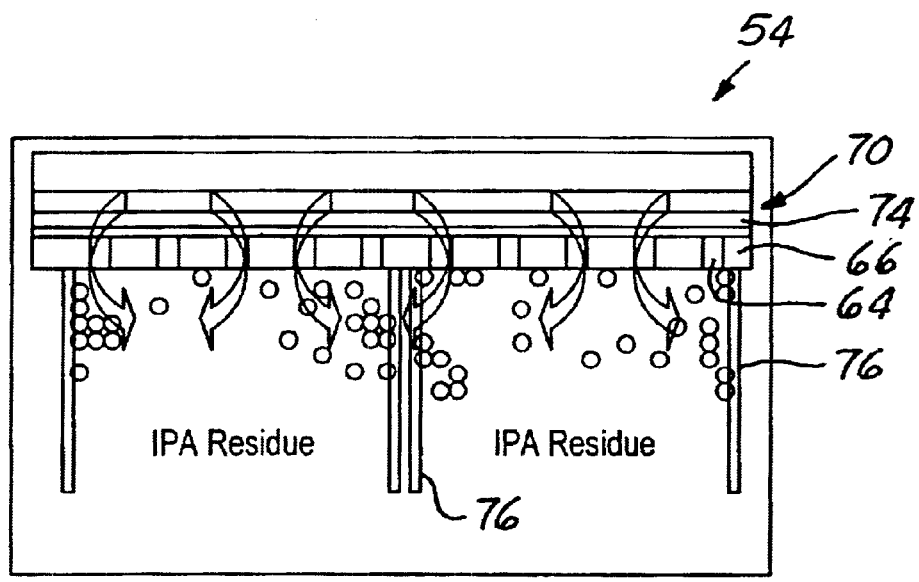
FIG. 3B is a cross-sectional view of the tank cover of the Maragoni dryer of FIG. 2.
Figure 4A:
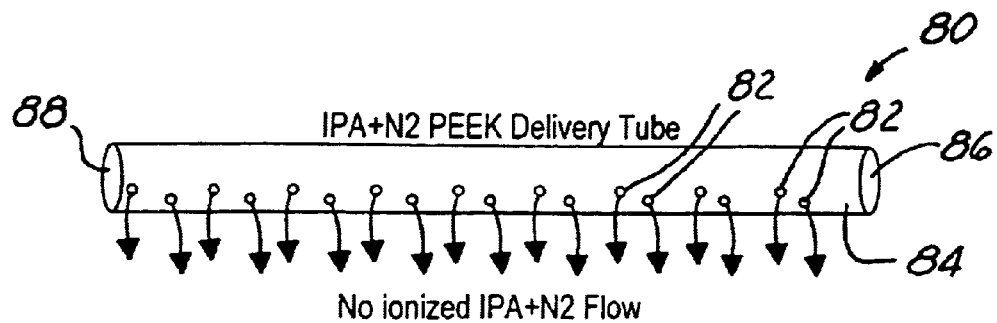
FIG. 4A is a perspective view of a solvent vapor delivery tube for the present invention solvent-type dryer.

Referring now to FIG. 4A, wherein a present invention solvent vapor delivery tube 80 is shown. The delivery tube 80 is constructed in an elongated shape with a circular cross-section and a thin wall construction. A plurality of apertures 82 is provided through the thin wall 84 of the delivery tube 80. A solvent vapor, such as isopropyl alcohol vapor mixed with a carrier gas, such as any inert gas and one of such is nitrogen, is flown into the delivery tube 80 at an inlet end 86, shown in FIG. 4A. To facilitate the further mixing of the solvent vapor/nitrogen mixture in the tube cavity, the opposite end 88 of the delivery tube 80 should be blocked. When the delivery tube 80 is fabricated of a polymeric material, such as PEEK, this can be easily accomplished by an injection molding process which readily provides the opposite end 88 and the multiplicity of apertures 82.

Figure 4B:
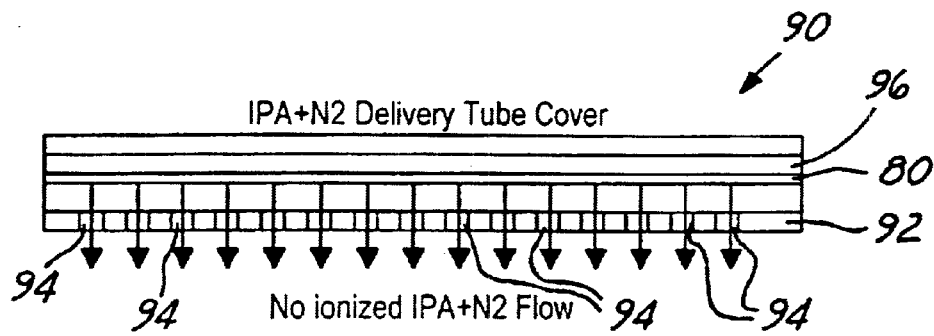
FIG. 4B is a cross-sectional view of the tank cover incorporating the solvent vapor delivery tube and an apertured lower plate for the tank cover.
Figure 4C:
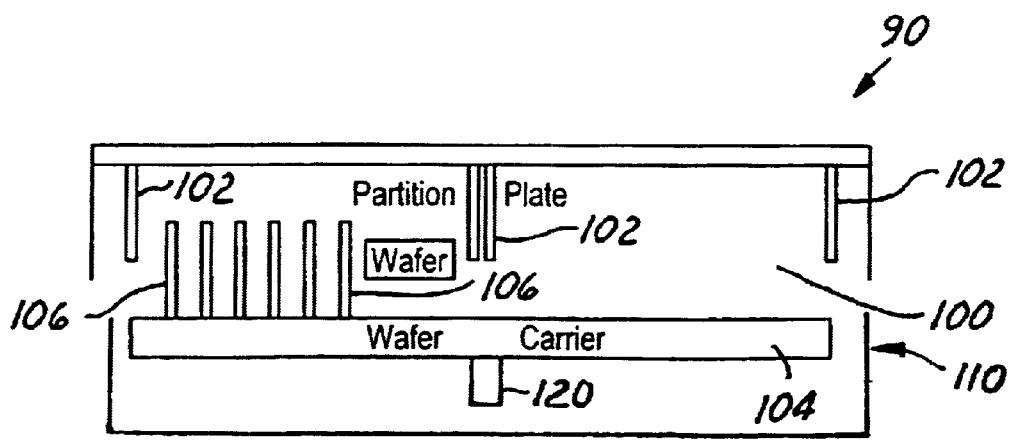
FIG. 4C is a cross-sectional view of the present invention tank cover situated in relation to a wafer carrier and a plurality of wafers carried therein.

The present invention delivery tube 80 fabricated in a non-electrostatic material is installed in a tank cover 90, as shown in FIG. 4B. It should be noted that a plurality of partition plates that are normally joined integrally with a bottom plate 92 of the tank cover 90 is not shown in FIG. 4B for simplicity reasons. It should be noted that a multiplicity of apertures 94 is provided in the bottom plate 92 for the tank cover 90. A cavity 96 is further provided in the tank cover 90 for accommodating the placement of the delivery tube 80, preferably centered by locating means (not shown) in the center cavity 96. The solvent vapor/inert gas mixture therefore exits the delivery tube 80 through the multiplicity of apertures 82 into the tank cover cavity 96. The solvent vapor/inert gas mixture is further mixed more thoroughly in the tank cover cavity 96 before exiting the multiplicity of apertures 94 into a tank cavity 100 contained in tank body 110, as shown in FIG. 4C. It should be noted that the tank cover 90 is shown in a simplified manner in FIG. 4C, i.e. without showing the delivery tube 80 or the bottom plate 92. A plurality of partition plates 102, i.e. at least four, for dividing the tank cavity 100 into two equal parts to facilitate more uniform drying of the wafers. A wafer carrier 104 equipped with elevator means 120 having a plurality of wafers 106 vertically positioned thereon are further shown in FIG. 4C.

According to the present invention preferred embodiment, at least one of the solvent vapor delivery tube 80, the tank cover 90, and the plurality of partition plates 102 is fabricated of the non-electrostatic material. Preferably, all three components that are in constant contact with the flow of solvent vapor should be fabricated of the non-electrostatic material.

In an alternate embodiment, the present invention novel electrostatic charge-free solvent-type dryer may optionally include a deionizer (not shown) which emits a flux of positive ions (not shown) into the tank cavity 100. The flux of positive ions is used to neutralize any negative ions which may have been generated from the solvent vapor, i.e. such as OH⁻ ions, that are produced from the alcohol, or isopropyl alcohol molecules in the flow of solvent vapor. The optional component of the deionizer therefore provides a further assurance that the present invention solvent-type dryer will guard against any possible generation of negative ions in the flow of solvent vapor and thus the generation of any possible electrostatic charge. The deionizer may be suitably mounted in the chamber cavity, such as attached mechanically to the interior chamber wall. Numerous deionizers may be utilized which are readily commercially available in the market.

The present invention novel electrostatic charge-free solvent-type dryer for drying semiconductor wafers after a wet bench process in both a preferred and an alternate embodiment have therefore been amply described in the above description and in the appended drawings of FIGS. 4A–4C. In the preferred embodiment, at least one of the major components that are in contact with a flow of solvent vapor, i.e. at least one of the tank cover, the solvent vapor delivery tube, and the plurality of partition plates is fabricated of a non-electrostatic material such that electrostatic charge cannot be generated in the flow of solvent vapor. In the alternate embodiment, an additional deionizer is further mounted inside the tank cavity for generating a flux of positive ions to neutralize any negative ions that may be generated in the flow of solvent vapor.

While the present invention has been described in an illustrative manner, it should be understood that the terminology used is intended to be in a nature of words of description rather than of limitation.

Furthermore, while the present invention has been described in terms of a preferred and an alternate embodiment, it is to be appreciated that those skilled in the art will readily apply these teachings to other possible variations of the inventions.

The embodiment of the invention in which an exclusive property or privilege is claimed are defined as follows.

What is claimed is:

1. A electrostatic charge-free solvent-type dryer for drying semiconductor wafers comprising:
   a tank body for holding a volume of water therein;
   a wafer carrier for holding a plurality of wafers therein;
   an elevator means for lowering and raising said wafer carrier into and out of said volume of water;
   a tank cover for covering an open top of said tank body forming a hermetically sealed cavity therein, said cover having a plurality of partition plates formed perpendicular to an interior surface of said cover extending downwardly into said tank cavity when said cover is mounted on said body;
   a conduit for feeding a flow of solvent vapor into said sealed cavity; and
   wherein at least one of said tank cover, said plurality of partition plates and said conduit is fabricated of a non-electrostatic material such that electrostatic charge is not generated in said flow of solvent vapor.

2. An electrostatic charge-free solvent-type dryer for drying semiconductor wafers according to claim 1, wherein said plurality of partition plates comprises at least three partition plates.

3. An electrostatic charge-free solvent-type dryer for drying semiconductor wafers according to claim 1, wherein said plurality of partition plates each having a height that is at least one-half of a height of said sealed cavity.

4. An electrostatic charge-free solvent-type dryer for drying semiconductor wafers according to claim 1, wherein said conduit feeds an alcohol vapor carried by a flow of inert gas.

5. An electrostatic charge-free solvent-type dryer for drying semiconductor wafers according to claim 1, wherein said conduit further comprises a multiplicity of apertures through a wall of said conduit for dispersing said solvent vapor into said sealed cavity.

6. An electrostatic charge-free solvent-type dryer for drying semiconductor wafers according to claim 1, wherein said non-electrostatic material is a polymeric material.

7. An electrostatic charge-free solvent-type dryer for drying semiconductor wafers according to claim 1, wherein said non-electrostatic material is a PEEK.

8. An electrostatic charge-free solvent-type dryer for drying semiconductor wafers according to claim 1, wherein said at least one of said tank cover, said plurality of partition plates and said conduit is fabricated of a non-electrostatic and hydrophobic material.

9. An electrostatic charge-free solvent-type dryer for drying semiconductor wafers according to claim 1, wherein said tank cover being provided with a cavity for receiving said conduit and said interior surface of said tank cover being provided with a multiplicity of apertures such that solvent vapor is dispersed by said tank cover through said multiplicity of apertures.

10. An electrostatic charge-free solvent-type dryer for drying semiconductor wafers according to claim 1 further comprising a deionizer for generating positive ions for feeding to said flow of solvent vapor.

11. An electrostatic charge-free solvent-type dryer for drying semiconductor wafers according to claim 1, wherein said plurality of partition plates being coated with a material comprises silicone for reducing organic residue deposition on said plurality of partition plates.

12. An electrostatic charge-free solvent-type dryer for drying semiconductor wafers according to claim 1, wherein said plurality of partition plates being formed of quartz for reducing organic residue deposition on said plurality of partition plates.

13. A electrostatic charge-free solvent-type dryer for drying semiconductor wafers comprising:
   a tank body for holding a volume of water therein;
   a wafer carrier for holding a plurality of wafers therein;
   an elevator means for lowering and raising said wafer carrier into and out of said volume of water;
   a tank cover for covering an open top of said tank body forming a hermetically sealed cavity therein, said cover having a plurality of partition plates formed perpendicular to an interior surface of said cover extending downwardly into said tank cavity when said cover is mounted on said body;
   a conduit for feeding a flow of solvent vapor into said sealed cavity;
   a deionizing means for generating a flux of positive ions to neutralize negative ions in said flow of solvent vapor; and
   wherein at least one of said tank cover, said plurality of partition plates and said conduit is fabricated of a non-electrostatic material such that electrostatic charge is not generated in said flow of solvent vapor.

14. An electrostatic charge-free solvent-type dryer for drying semiconductor wafers according to claim 13, wherein said plurality of partition plates being coated with a material comprises silicone for reducing organic residue deposition on said plurality of partition plates.

15. An electrostatic charge-free solvent-type dryer for drying semiconductor wafers according to claim 13, wherein said plurality of partition plates being formed of quartz for reducing organic residue deposition on said plurality of partition plates.

16. An electrostatic charge-free solvent-type dryer for drying semiconductor wafers according to claim 13, wherein said conduit further comprises a multiplicity of apertures through a wall of said conduit for dispersing said solvent vapor into said sealed cavity.

17. An electrostatic charge-free solvent-type dryer for drying semiconductor wafers according to claim 13, wherein said non-electrostatic material is a PEEK.

18. An electrostatic charge-free solvent-type dryer for drying semiconductor wafers according to claim 13, wherein said at least one of said tank cover, said plurality of partition plates and said conduit is fabricated of a non-electrostatic and hydrophobic material.

19. An electrostatic charge-free solvent-type dryer for drying semiconductor wafers according to claim 13, wherein said tank cover being provided with a cavity for receiving said conduit and said interior surface of said tank cover being provided with a multiplicity of apertures such that solvent vapor is dispersed by said tank cover through said multiplicity of apertures.

20. An electrostatic charge-free solvent-type dryer for drying semiconductor wafers according to claim 13, wherein said plurality of partition plates comprises at least three partition plates, each of said plates having a height that is at least one-half of a height of said sealed cavity.

* * * * *